(12) United States Patent
Lof

(10) Patent No.: US 7,808,613 B2
(45) Date of Patent: Oct. 5, 2010

(54) INDIVIDUAL WAFER HISTORY STORAGE FOR OVERLAY CORRECTIONS

(75) Inventor: Joeri Lof, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 497 days.

(21) Appl. No.: 11/498,268

(22) Filed: Aug. 3, 2006

(65) Prior Publication Data

US 2008/0030701 A1 Feb. 7, 2008

(51) Int. Cl.
G03B 27/42 (2006.01)
(52) U.S. Cl. .......................................... 355/53; 355/52
(58) Field of Classification Search .............. 356/237.1; 355/30, 53
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,949,755 B2 | 9/2005 | Tanaka | 250/491.1 |
| 6,972,852 B2 | 12/2005 | Opsal et al. | 356/625 |
| 6,974,962 B2 | 12/2005 | Brill et al. | 250/548 |

(Continued)

FOREIGN PATENT DOCUMENTS

JP 05-217843 A 8/1993

(Continued)

OTHER PUBLICATIONS

Translation of jp 2001167996a is attached.*

(Continued)

*Primary Examiner*—Edward J Glick
*Assistant Examiner*—Mesfin T Asfaw
(74) *Attorney, Agent, or Firm*—Pillsbury Winthrop Shaw Pittman LLP

(57) ABSTRACT

The invention relates to a device manufacturing method comprising identifying a substrate to be processed, performing a manufacturing step of a patterned layer on the substrate, and storing a substrate process history for the substrate. The history may comprise a correction map comprising position errors caused by the manufacturing step. Identifying the substrate may be done by reading an identification sign present on the substrate or by reading an identification code of a lot comprising the substrate and determining a sequence number of the substrate in the lot. Alignment of the substrate with respect to a patterning device of a lithographic apparatus may be corrected using information of the substrate process history. Alternatively or additionally, measured overlay errors may be corrected per substrate using information of the substrate process history.

18 Claims, 4 Drawing Sheets

U.S. PATENT DOCUMENTS

| | | |
|---|---|---|
| 6,987,572 B2 | 1/2006 | Lakkapragada et al. ..... 356/601 |
| 7,046,376 B2 | 5/2006 | Sezginer ................... 356/601 |
| 7,061,615 B1 | 6/2006 | Lowe-Webb ............... 356/401 |
| 7,061,623 B2 | 6/2006 | Davidson .................. 356/497 |
| 7,061,627 B2 | 6/2006 | Opsal et al. ................ 356/601 |
| 7,068,363 B2 | 6/2006 | Bevis et al. ............. 356/237.5 |
| 7,138,283 B2 | 11/2006 | Matsushita et al. |
| 7,259,828 B2 | 8/2007 | Tolsma et al. |
| 2002/0109825 A1 | 8/2002 | Gui et al. ..................... 355/53 |
| 2003/0211297 A1 | 11/2003 | Rossing et al. ........... 428/195.1 |
| 2004/0070740 A1 | 4/2004 | Irie ............................. 355/52 |
| 2004/0119970 A1* | 6/2004 | Dusa et al. ............. 356/237.1 |
| 2004/0156027 A1 | 8/2004 | Best et al. ................... 355/53 |
| 2005/0195378 A1 | 9/2005 | Van Der Veen et al. ....... 355/53 |
| 2005/0248740 A1 | 11/2005 | Veen et al. ................... 355/53 |
| 2006/0033921 A1 | 2/2006 | Den Boef et al. ........... 356/446 |
| 2006/0066855 A1 | 3/2006 | Boef et al. .................. 356/401 |
| 2006/0072087 A1 | 4/2006 | Klinkhamer et al. .......... 355/53 |
| 2006/0126074 A1 | 6/2006 | Van Der Werf et al. ..... 356/489 |
| 2006/0139592 A1 | 6/2006 | Den Boef et al. ............. 355/53 |

FOREIGN PATENT DOCUMENTS

| | | |
|---|---|---|
| JP | 05-259010 A | 10/1993 |
| JP | 09-275066 A | 10/1997 |
| JP | 2001167996 A * | 6/2001 |
| JP | 2002-280299 A | 9/2002 |

OTHER PUBLICATIONS

"Matrix coding for optical identification of die", Research Disclosure Database No. 467095 (Mar. 2003).

* cited by examiner

INDIVIDUAL WAFER HISTORY STORAGE FOR OVERLAY CORRECTIONS

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Currently, one or more corrections for process induced overlay errors is measured on a lot to lot basis. Process variations are often dependent on the history of the individual substrate (e.g., wafer). For example, they may depend on which chemical mechanical polishing (CMP) tool or post bake plate has been used, etc. Since automatic processing corrections (APC) work on a lot to lot basis, they cannot correct for these substrate to substrate variations.

SUMMARY

It is desirable, for example, to provide a method for automatic processing of corrections on a substrate to substrate basis.

According to an aspect of the invention, there is provided a device manufacturing method comprising:

identifying a substrate to be processed;

performing a manufacturing step of a patterned layer on the substrate;

storing a substrate process history for the substrate; and transferring a pattern of a patterning device onto the substrate wherein alignment of the substrate with respect to the patterning device is corrected using information of the substrate process history, or measuring overlay errors on the substrate and correcting measured overlay errors using information of the substrate process history, or both the transferring and measuring.

The substrate process history may comprise one or more correction maps comprising position errors caused by the manufacturing step of the patterned layer.

Identifying the substrate may comprise reading an identification sign that is present on the substrate. Alternatively or additionally, the substrate may be identified by reading an identification code of a lot comprising the substrate and determining a sequence number of the substrate in the lot.

According to another aspect of the invention, there is provided a device manufacturing system comprising:

a substrate identification module arranged to identify a substrate to be processed;

a memory configured to hold a substrate process history for the substrate;

a module configured to perform a manufacturing step of a patterned layer on the substrate; and a processor configured to correct alignment of the substrate with respect to a patterning device used to transfer a pattern onto the substrate, using information of the substrate process history, or correct measured overlay errors using information of the substrate process history, or correct both alignment and measured overlay errors.

According to another aspect of the invention, there is provided a device manufacturing system comprising a lithographic apparatus, a processor, a memory, and a substrate identification module arranged to identify a substrate to be processed in the lithographic apparatus, wherein the processor is arranged to:

receive substrate identification data from the substrate identification module;

receive processing data of the substrate from the lithographic apparatus; and store the processing data and corresponding identification data in the memory to render a substrate process history.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
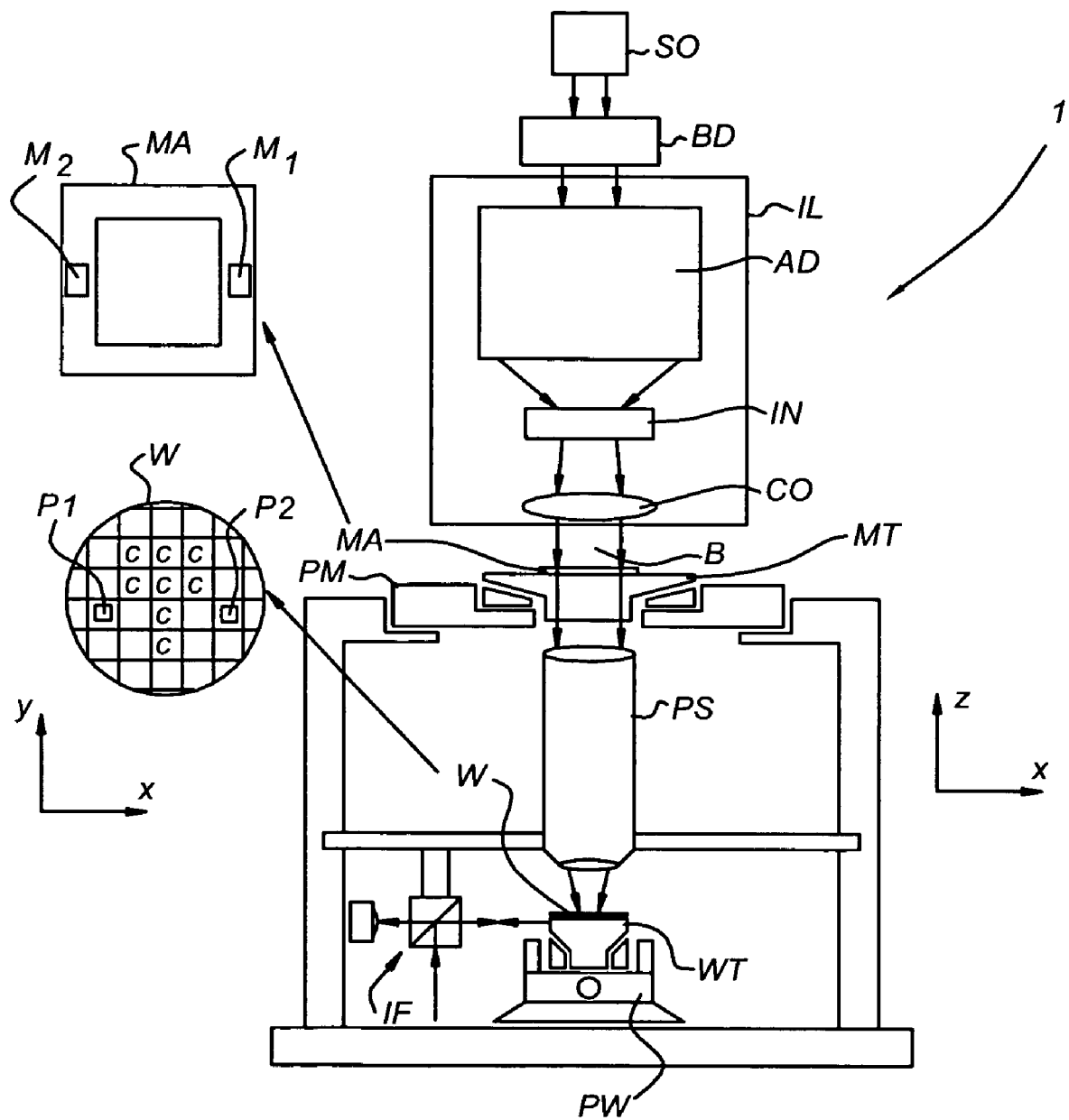
FIG. 1 depicts a lithographic apparatus according to an embodiment of the invention.

FIG. 1 schematically depicts a lithographic apparatus 1 according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
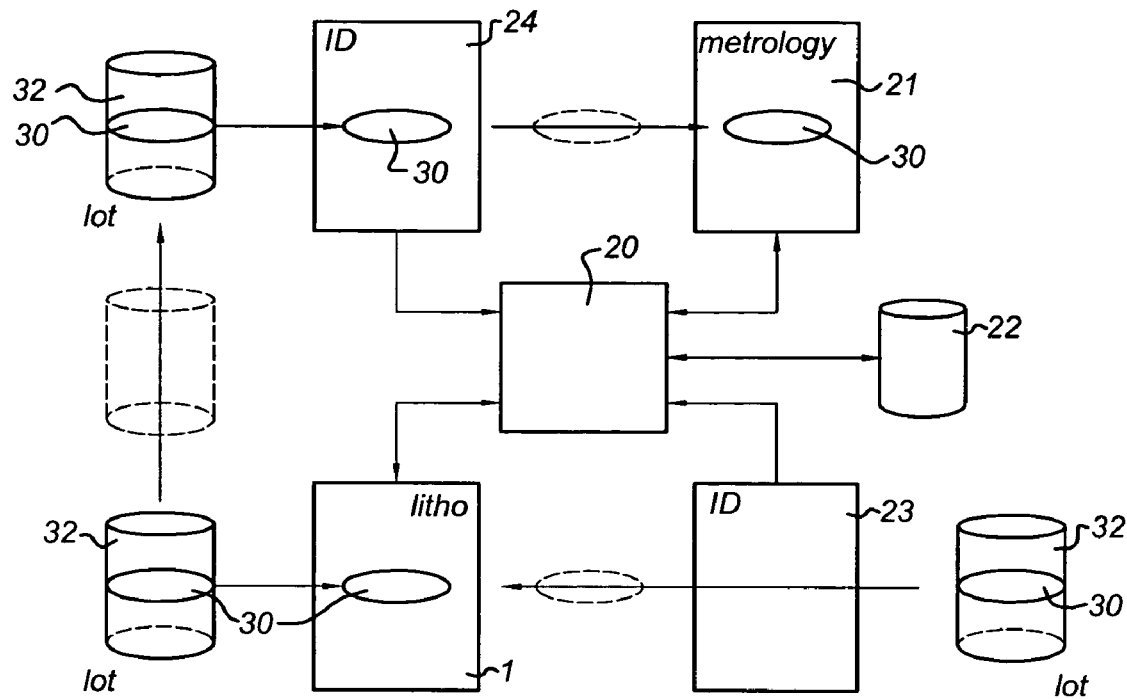
FIG. 2 depicts part of a device manufacturing system according to an embodiment.

FIG. 2 depicts part of a device manufacturing system according to an embodiment of the invention. The device manufacturing system comprises the lithographic apparatus 1, a processor 20, a metrology tool 21 and a memory 22. Furthermore, the system comprises two substrate identification modules 23, 24 arranged to identify a substrate 30 to be processed. In FIG. 2, the substrate 30 is transported to the lithographic apparatus 1 in a box 32 also referred to as lot 32.

Figure 3:
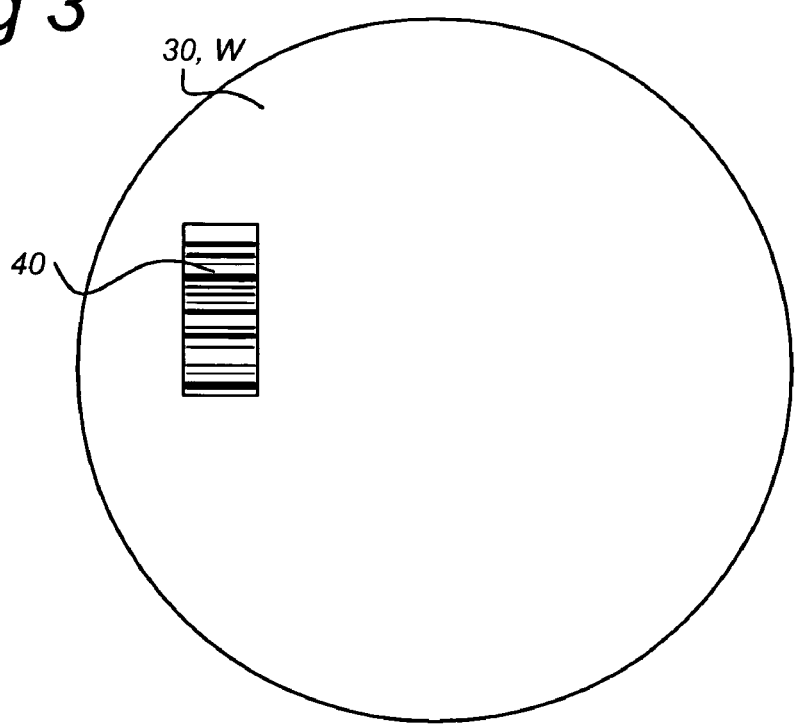
FIG. 3 shows an example of a identification sign on a substrate.

Having arrived at the lithographic apparatus 1, the substrate 30 is picked out of the lot 32 and identified by the ID module 23. Identifying the substrate 30 may comprise reading an identification sign 40 present on the substrate 30 (see FIG. 3). The identification sign 40 may be a bar code readable by a bar code scanner arranged in the ID modules 23, 24. Instead of using a bar code or the like, it is possible to identify the lot 32 and determine a sequence number for the substrate 30 in the lot 32. So for example, a substrate may have identification code "lot B0012—third substrate". Identification of the lot 32 may be performed using known techniques, such as optical code reading.

In the example of FIG. 2, the substrate 30 already comprises a first patterned layer processed using the lithographic apparatus 1 (or any other apparatus suitable to make a first patterned layer) at an earlier stage. The first patterned layer on the substrate 30 may be manufactured using a common manufacturing process comprising one or more of the following procedures:

placing the substrate onto the substrate table WT of the lithographic apparatus 1;

projecting a further patterned beam of radiation onto the substrate using the projection system PS;

chemical mechanical polishing of the substrate using a specific polishing tool;

etching the substrate using a specific etch tool;

heating the substrate using a specific bake plate; or depositing a layer of material on the substrate at a specific deposition tool.

In addition to the above mentioned procedures, applying a resist layer, for example, is needed, but such a procedure (or other procedures) is not relevant for the discussion herein.

The processor 20 is arranged to receive substrate identification data from the substrate identification modules 23, 24 and to receive processing data of the substrate 30 from the lithographic apparatus 1. The processing data received from the lithographic apparatus 1 may comprise a so-called correction map with one or more position errors caused by the lithographic apparatus 1. Alternatively, the processor 20 may receive processing data which is then converted into a correction map by the processor 20. Alternatively, the processor 20 may receive processing data that is stored and which is later converted into a correction map by the lithographic apparatus 1.

A correction map may comprise for each of a plurality of points X,Y on the substrate 30 an X,Y-error caused by a certain tool for which the correction map is applicable. It is noted that such a correction map comprises predictions for the X,Y-errors, and not actual X,Y-errors. The predictions are calculated using, for example, an aberration model for the projection system PS or a surface map of the substrate table WT as will be described in more detail below. According to an embodiment, for each substrate 30, a substrate process history comprising one or more correction maps is stored in the memory 22.

Using a unique identification of the substrate 30, it is possible to record, store and retrieve the history of the substrate 30 during a complete production process.

The substrate process history can be implemented in various degrees of sophistication. For example the following information could be part of the substrate process history:

a surface correction map of the substrate table WT;

a contamination correction map of the substrate table WT;

a tilt correction map of the substrate table WT;

a substrate heating correction map of the substrate 30;

a polishing correction map of a polishing tool used;

a bake plate correction map of a bake plate used;

an etch tool correction map of an etch tool used;

a deposition tool correction map of a deposition tool used.

The different correction maps listed above are also referred to as 'fingerprints'. According to an embodiment, the finger prints of a plurality of tools or parts used during the manufacturing process are collected and a total fingerprint, being a sum of one or more of the fingerprints listed, is used to optimize alignment of the substrate 30 with respect to the patterning device (e.g., mask). As a consequence, the overlay error may be reduced. Each of the different fingerprints listed above are discussed in more detail below.

The surface correction map of a substrate table WT may comprise height (i.e. Z-direction) information for a plurality of X,Y positions on the substrate table WT. As will be known to the skilled person, a non-flat substrate table may result in X,Y-errors during exposure of the first layer. Instead of height information, the surface correction map may comprise X,Y-errors directly related to the height information. By incorporating the surface correction map for one or more substrate tables WT used, so-called 'chuck-to-chuck' and 'machine-tomachine' corrections can be applied without the need to use the same machine (lithographic apparatus 1) or chuck (i.e. substrate table WT).

The contamination correction map comprises X,Y-position errors which are induced by contamination on the substrate table WT. Contamination between the substrate table W and the substrate 30 may result in substrate deformation which in turn leads to Z-deviations which as discussed above results in X,Y-position errors during exposure of the first layer.

The tilt correction map comprises position errors induced by local tilt of the substrate table WT. Local tilt of the substrate table WT has the same effect as contamination of the substrate table WT described above.

The substrate heating correction map comprises position errors resulting from thermal deformation of the substrate 30 or the substrate table WT. During exposure, the radiation heats up the substrate 30 and substrate table WT. This heating results in a deformation of the substrate W and the substrate table WT. This deformation causes a position error of the pattern during the exposure of the first layer.

The polishing correction map comprises position errors induced by a polishing tool used. The chemical and mechanical interaction between the substrate and the polishing at CMP tool may cause position offsets in the first patterned layer. These position offsets may vary over the substrate surface. Each polishing tool will likely have a systematic pattern of offsets in addition to a random pattern of offsets. The systematic pattern can be used to correct the exposure of the next layer.

The bake plate correction map comprises errors resulting from the heat distribution of a bake plate which results in differences in distribution of temperature for different bake plates. The correction map may be created by using a model for each bake plate, and recording the bake plate which is used for the substrate.

The etch tool correction map comprises position errors induced by an etch tool used. The interaction of an etching agent and the substrate may cause position offsets in the patterned layer. A systematic pattern caused by an etch tool can be measured and used as a correction map.

The deposition tool correction map comprises position errors induced by a deposition tool used. Depositing a layer of material on a substrate may cause position errors, for example, by stress induced in the deposited layer. Thickness variations in the deposited layer caused by the depositing tool may cause position errors in later steps of the manufacturing process, for example, because of a different interaction with a chemical mechanical polish tool or with an etching agent. Information about the systematic pattern of the deposited layer connected to the specific depositing tool can be used to correct for position errors.

No understanding of the physical mechanism behind these positions errors or a model of this mechanism is necessary to provide the above-mentioned correction maps or fingerprints. It is possible to determine the correction map for a specific processing tool, part or step based on historical data of measured position errors. If sufficient data is available, correction maps for all the relevant processing tools, parts or steps or for a combination thereof in the sequence can be derived. These correction maps can then be applied to a substrate that has the same history (sequence of processing tools, part or steps).

According to an embodiment, the substrate process history comprises an aberration correction map comprising projection system induced errors caused by aberrations of the projection system. An example of projection system induced errors will now be discussed with reference to FIGS. 4A and 4B.

Figure 4A:
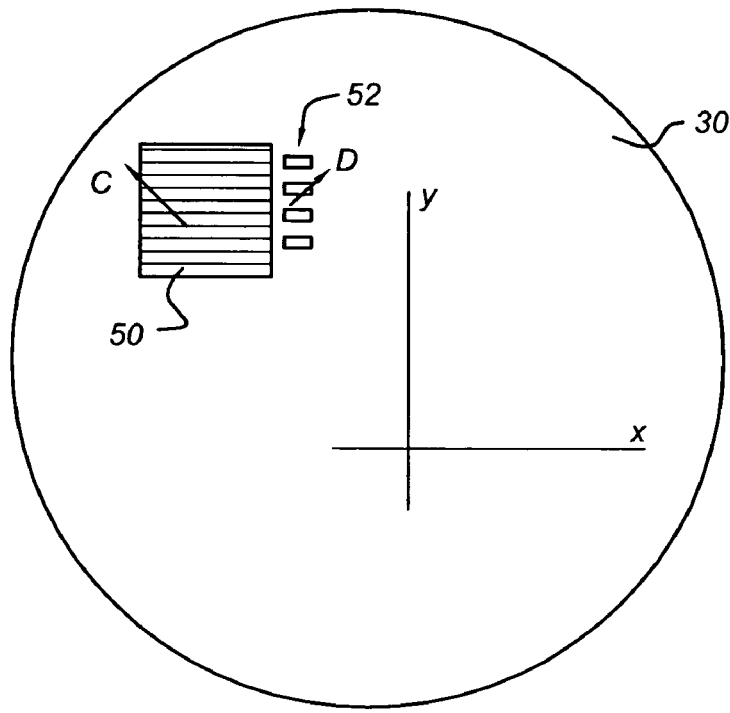
FIG. 4A shows part of a first patterned layer and an alignment mark on a substrate.
Figure 4B:
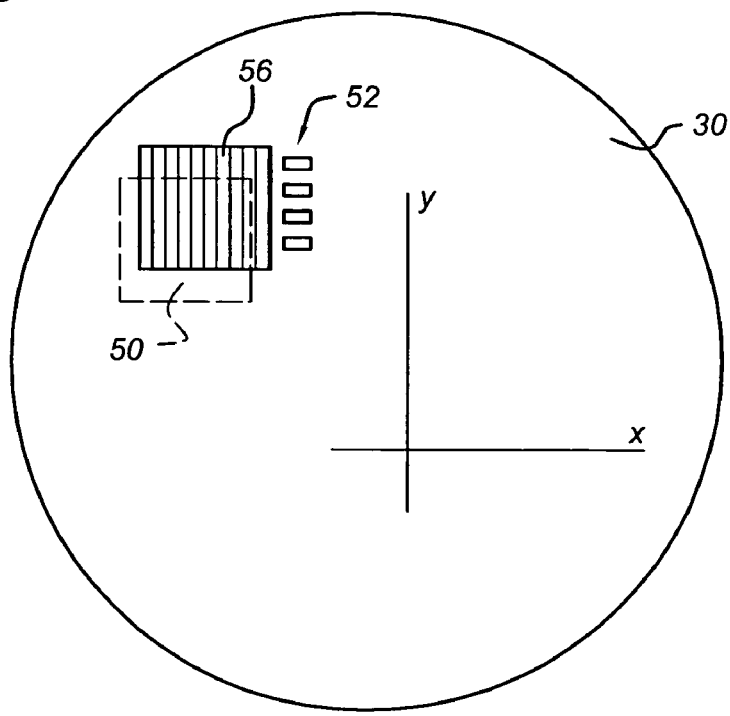
FIG. 4B shows the substrate of FIG. 4A and part of a second patterned layer on top of the first layer in which an alignment error is indicated.

FIG. 4A shows part of a first patterned layer manufactured on the substrate 30. The first patterned layer comprises a device structure 50 and some corresponding alignment structure 52. In FIGS. 4A and 4B, a reference coordinate system is indicated by an X-axis and a Y-axis. This reference coordinate system is also referred to as 'the nominal grid'. With a vector C a position offset with reference to the nominal grid is indicated for the device structure 50. This offset is caused by projection system aberrations as will be known to the skilled person. FIG. 4A also shows a vector D indicating an offset with reference to the nominal grid for the alignment structure 52 caused by projection system aberrations. The device structure 50 has a relatively small pitch with respect to the pitch of the alignment structure 52. An alignment structure may be very different from critical product structures, such as the device structure 50. Therefore, when imaged, the radiation beam for patterning the alignment structure may follow a different path through the projection system PS than that for the device structure 50. Therefore, the projection system aberrations may cause different offsets for the device structure 50 and the alignment structure 52.

FIG. 4B shows the substrate 30 of FIG. 4A and part of a second patterned layer on top of the first layer. The second layer comprises a device structure 56 which needs to be provided on top of the device structure 50. The lithographic apparatus 1 is arranged to locate the alignment mark 52 and use the position of the alignment mark 52 in order to align the substrate 30 to expose the device structure 56. Due to the difference between vector C and vector D, the device structure 56 will get an offset of D-C with reference to device structure 50. This offset can be corrected by correcting the alignment of the substrate 30 with respect to the patterning device MA. In the manufacturing method according to an embodiment, a patterned beam of radiation is projected onto the substrate 30 using the patterning device MA, wherein alignment of the substrate 30 with respect to the patterning device MA is corrected using information on offset errors (e.g., D-C) induced by projection system aberrations. To do this, the offsets C and D have to be determined based on a projection system aberration model during exposure of the first layer and stored with a substrate index as reference.

A correction map comprising errors for a plurality of points on the substrate 30 may be generated by the lithographic apparatus 1. According to an embodiment, the correction map or fingerprint, is calculated after processing the first layer. The correction map is stored in the database 22, and will be retrieved by the processor 20 before processing the second layer. Values for C and D can be calculated using a specific projection system aberration model. The projection system aberration model can be used to predict aberrations and the corresponding offsets for the different possible structures.

In the example of FIG. 4B, the correction map will comprise vectors such as D-C which are then used by the processor 20 and/or the lithographic apparatus 1 to align the substrate 30 with respect to the patterning device MA by means of, for example, moving the substrate table WT. By correcting for the offsets induced by the projection system aberrations, the overlay may be significantly improved.

After processing a second layer, the substrate 30 may be moved to the metrology tool 21 as is shown in FIG. 2. At the metrology tool 21 overlay errors are measured using positions of metrology structures which are manufactured on the substrate 30 along with the device structures 50, 52. According to an embodiment, the metrology tool 21 is arranged to measure overlay errors on the substrate 30, wherein the processor 20 is arranged to receive the measured overlay errors from the metrology tool 21. The processor 20 then corrects the measured overlay errors using information of the substrate process history.

Figure 5A:
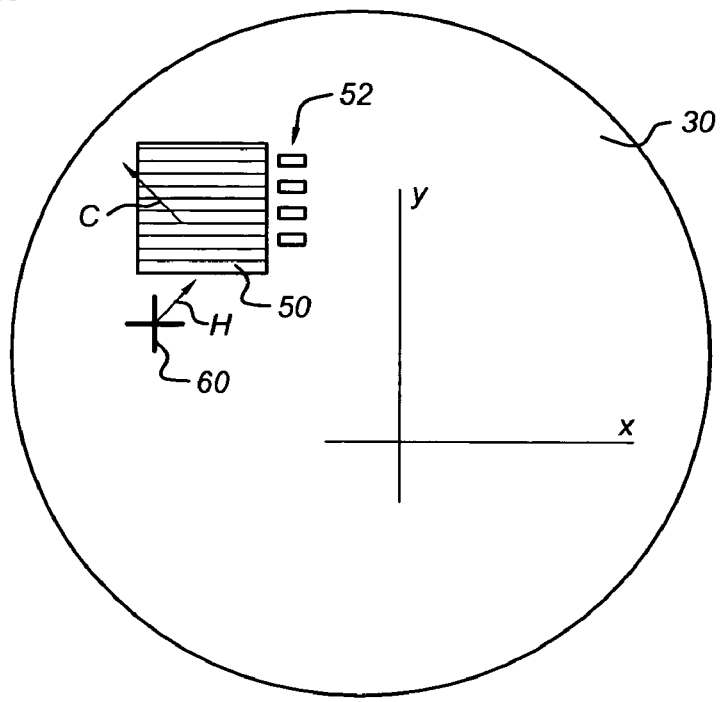
FIG. 5A shows part of a first patterned layer, an alignment mark and a metrology structure on a substrate.

An example explaining the nature of overlay measurement errors resulting from aberrations of the projection system PS is described next. FIG. 5A shows a part of the first patterned layer 50, an alignment mark 52 and a first part 60 of a metrology structure in a first patterned layer on the substrate 30. The first part 60 of the metrology structure may, for example, comprise a cross as is shown in FIG. 5A. In FIG. 5A a vector C represents an offset of the device structure 50 in the first patterned layer with reference to the nominal grid. A vector H indicates an offset of the first part 60 of the metrology structure in the first patterned layer.

Figure 5B:
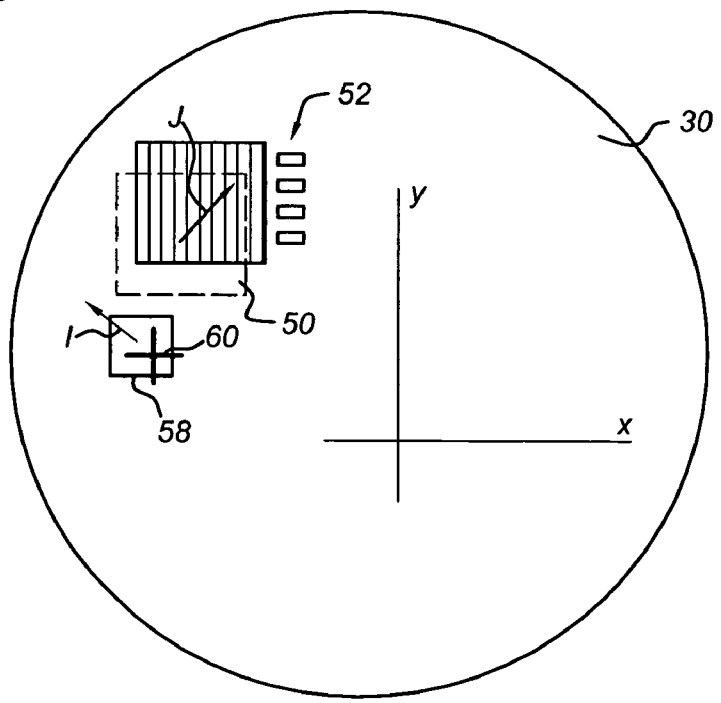
FIG. 5B shows the substrate of FIG. 5A and part of a second patterned layer on top of the first layer in which an alignment error and an offset of the metrology structure are indicated.

FIG. 5B shows the substrate 30 of FIG. 5A and part of a second patterned layer processed on top of the first patterned layer. In FIG. 5B, a vector J indicates an offset of the device structure 56 in the second patterned layer with respect to the nominal grid. A vector I indicates an offset of a second part 58 of the metrology structure in the second patterned layer. In this example the second part 58 of the metrology structure is a square (see FIG. 5B).

The actual overlay error between the device structures 50 and 56 of the first and second layers is J-C and can now be calculated as follows:

$$J-C = (I+(I-J)) - (H+(H-C)) = I-H+(I-J)-(H-C) \quad (1)$$

The value I-H represents the measured overlay error between the first 60 and second 58 parts of the metrology structure measured by the metrology tool 21. The value I-J may be derived by using a model of the projection system PS in the lithographic apparatus 1 with parameter valid during the first exposure. The value H-C may be derived using parameter settings during the second exposure. The value of J-C may be determined for a plurality of points on the substrate 30 to render a projection system aberration correction map.

In an embodiment of the invention, a correction map of all relevant processing tools, parts or steps in a manufacturing process are determined individually and a total correction map for each substrate is determined for each exposure based on a function (e.g. sum) of all correction maps. This may lead to improving overlay and/or metrology even further.

Identifying the substrate 30 can be done in many different ways. It could be done from a central processor ('fab host') communicating with the lithographic apparatus 1 (e.g., combination of lot id and substrate sequence number). Identification of the substrate 30 may partly be performed locally (i.e. reading a lot id and communicating the substrate sequence) or fully locally (i.e. reading substrate id). Reading a substrate identification can be done by any known technique.

It will be appreciated that an embodiment of the invention may be practiced otherwise and that for example, the processor 20 may be part of the lithographic apparatus 1 or part of the metrology tool or any other tool used to process the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising:
   identifying a substrate to be processed;
   performing a manufacturing step of a patterned layer on the substrate;
   storing a correction map comprising a spatial distribution of correction data for the substrate or the data to generate the correction map, in association with the identification of the substrate, the correction map comprising, for each of a plurality of points on the substrate, a predicted error caused by an apparatus used to process the substrate, wherein the correction map comprises one or more selected from:
   a surface correction map of a substrate table,
   a contamination correction map comprising substrate table contamination induced errors,
   a tilt correction map comprising substrate table local tilt induced errors,
   a substrate heating correction map comprising thermal induced substrate deformation errors caused by thermal heating of the substrate during an exposure, a polishing correction map comprising polishing system induced errors, a bake plate correction map comprising bake plate induced errors, an etch tool correction map comprising etch tool induced errors, or an aberration correction map comprising projection system induced errors caused by aberrations of a projection system used to transfer a pattern to the substrate; and transferring a pattern of a patterning device onto the substrate wherein alignment of the substrate with respect to the patterning device is corrected using information of the correction map identified for the substrate or the data to generate the correction map, or measuring overlay errors on the substrate and correcting measured overlay errors using information of the correction map identified for the substrate or the data to generate the correction map, or both the transferring and measuring.

2. The method of claim 1, wherein identifying the substrate comprises reading an identification sign present on the substrate.

3. The method of claim 1, wherein identifying the substrate comprises reading an identification code of a lot comprising the substrate and determining a sequence number of the substrate in the lot.

4. The method of claim 1, wherein the manufacturing step comprises one or more selected from:
   placing the substrate onto a substrate table of a lithographic apparatus;
   transferring a further pattern onto the substrate;
   chemical mechanical polishing of the substrate using a specific polishing tool;
   etching the substrate using a specific etch tool;
   heating the substrate using a specific bake plate; or
   depositing a layer of material on the substrate.

5. The method of claim 4, wherein the correction map comprises an aberration correction map comprising projection system induced errors caused by aberrations of a projection system used to transfer a pattern to the substrate.

6. The method of claim 5, wherein the aberration correction map is determined using a projection system aberration model.

7. The method of claim 5, wherein the aberration correction map comprises position offsets of alignment marks with respect to associated device structures.

8. The method of claim 5, wherein the aberration correction map comprises position offsets of metrology structures with respect to associated device structures.

9. A device manufacturing system comprising:
   a substrate identification module arranged to identify a substrate to be processed;
   a memory holding, in use, a correction map comprising a spatial distribution of correction data for the substrate or the data to generate the correction map, in association with the identification of the substrate, the correction map comprising, for each of a plurality of points on the substrate, a predicted error caused by an apparatus used to process the substrate, wherein the correction map comprises one or more selected from:
   a surface correction map of a substrate table,
   a contamination correction map comprising substrate table contamination induced errors,
   a tilt correction map comprising substrate table local tilt induced errors,
   a substrate heating correction map comprising thermal induced substrate deformation errors caused by thermal heating of the substrate during an exposure,
   a polishing correction map comprising polishing system induced errors,
   a bake plate correction map comprising bake plate induced errors,
   an etch tool correction map comprising etch tool induced errors, or
   an aberration correction map comprising projection system induced errors caused by aberrations of a projection system used to transfer a pattern to the substrate;
   a module configured to perform a manufacturing step of a patterned layer on the substrate; and
   a processor configured to correct alignment of the substrate with respect to a patterning device used to transfer a pattern onto the substrate, using information of the correction map identified for the substrate or the data to generate the correction map, or correct measured overlay errors using information of the correction map identified for the substrate or the data to generate the correction map, or correct both alignment and measured overlay errors.

10. The system of claim 9, further comprises a module configured to measure the overlay errors on the substrate.

11. The system of claim 9, wherein the module is configured to one or more selected from:
    place the substrate onto a substrate table of a lithographic apparatus;
    transfer a further pattern onto the substrate;
    chemical mechanical polish the substrate;
    etch the substrate;
    heat the substrate; or
    deposit a layer of material on the substrate.

12. The system of claim 11, wherein the correction map comprises an aberration correction map comprising projection system induced errors caused by aberrations of a projection system used to transfer a pattern to the substrate.

13. The system of claim 12, wherein the aberration correction map is determined using a projection system aberration model.

14. The system of claim 12, wherein the aberration correction map comprises position offsets of alignment marks with respect to associated device structures.

15. The system of claim 12, wherein the aberration correction map comprises position offsets of metrology structures with respect to associated device structures.

16. A device manufacturing system comprising a lithographic apparatus, a processor, a memory, and a substrate identification module arranged to identify a substrate to be processed in the lithographic apparatus, wherein the processor is arranged to:
    receive substrate identification data from the substrate identification module;
    receive processing data of the substrate from the lithographic apparatus, the processing data comprising a correction map for the substrate or the data to generate the correction map, the correction map comprising, for each of a plurality of points on the substrate, a predicted error caused by the lithographic apparatus to process the substrate, wherein the correction map comprises one or more selected from:
    a surface correction map of a substrate table of the lithographic apparatus,
    a contamination correction map comprising substrate table contamination induced errors, a tilt correction map comprising substrate table local tilt induced errors, a substrate heating correction map comprising thermal induced substrate deformation errors caused by thermal heating of the substrate during an exposure using the lithographic apparatus, or an aberration correction map comprising projection system induced errors caused by aberrations of a projection system of the lithographic apparatus used to transfer a pattern to the substrate; and store the processing data and corresponding identification data in the memory to render a substrate process history.

17. The system of claim 16, wherein the lithographic apparatus comprises:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the processor is arranged to correct alignment of the patterning device and substrate based on the substrate process history.

18. The system of claim 16, further comprising a metrology tool arranged to measure overlay errors on the substrate, wherein the processor is arranged to receive the measured overlay errors from the metrology tool and correct the measured overlay errors using the substrate process history.

* * * * *